(12) United States Patent
Ando et al.

(10) Patent No.: US 6,433,412 B2
(45) Date of Patent: Aug. 13, 2002

(54) SEMICONDUCTOR DEVICE AND A METHOD OF MANUFACTURING THE SAME

(75) Inventors: Hideko Ando, Hamura; Hiroshi Kikuchi, Hidaka; Ikuo Yoshida, Musashimurayama; Toshihiko Sato, Sayama; Tomo Shimizu, Ome, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/800,589

(22) Filed: Mar. 8, 2001

(30) Foreign Application Priority Data

Mar. 17, 2000 (JP) ........................................ 2000-076709

(51) Int. Cl.⁷ .............................................. H01L 23/02
(52) U.S. Cl. ...................... 257/678; 257/676; 257/680; 257/704; 257/710; 257/730; 257/731
(58) Field of Search ................................ 257/676, 680, 257/704, 710, 730, 731; 438/612, 613, 614, 615

(56) References Cited

U.S. PATENT DOCUMENTS 6,165,885 A * 12/2000 Gaynes et al. .............. 438/612
6,239,486 B1 * 5/2001 Shimizu et al. ............. 257/704

FOREIGN PATENT DOCUMENTS

JP          8-46098          2/1996

* cited by examiner

*Primary Examiner*—David Nelms
*Assistant Examiner*—Mai-Huong Tran
(74) *Attorney, Agent, or Firm*—Mattingly, Stanger & Malur, P.C.

(57) ABSTRACT

A central portion of a main face of a package substrate 2 is mounted with a memory chip 1 using face down bonding by a flip chip bonding system. Further, a plurality of chip condensers 7 are mounted at vicinities of the memory chip 1. A clearance between a main face (lower face) of the memory chip 1 and a main face of the package substrate 2 is filled with underfill resin (seal resin) 10 constituting a seal member for achieving protection of connecting portions and for relaxation of thermal stress. An outer edge of the underfill resin 10 is extended to an outer side of the memory chip 1 and covers entire faces of the chip condensers 7 mounted at vicinities of the memory chip 1.

9 Claims, 16 Drawing Sheets

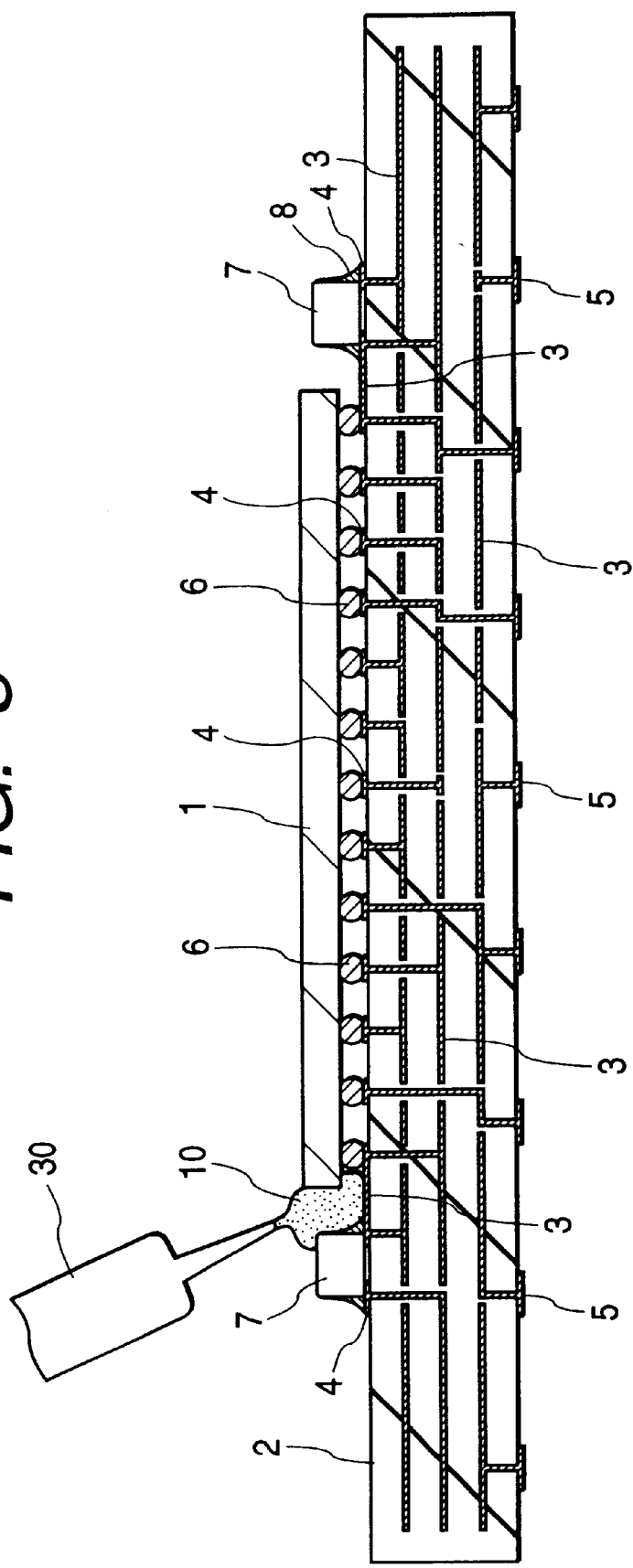

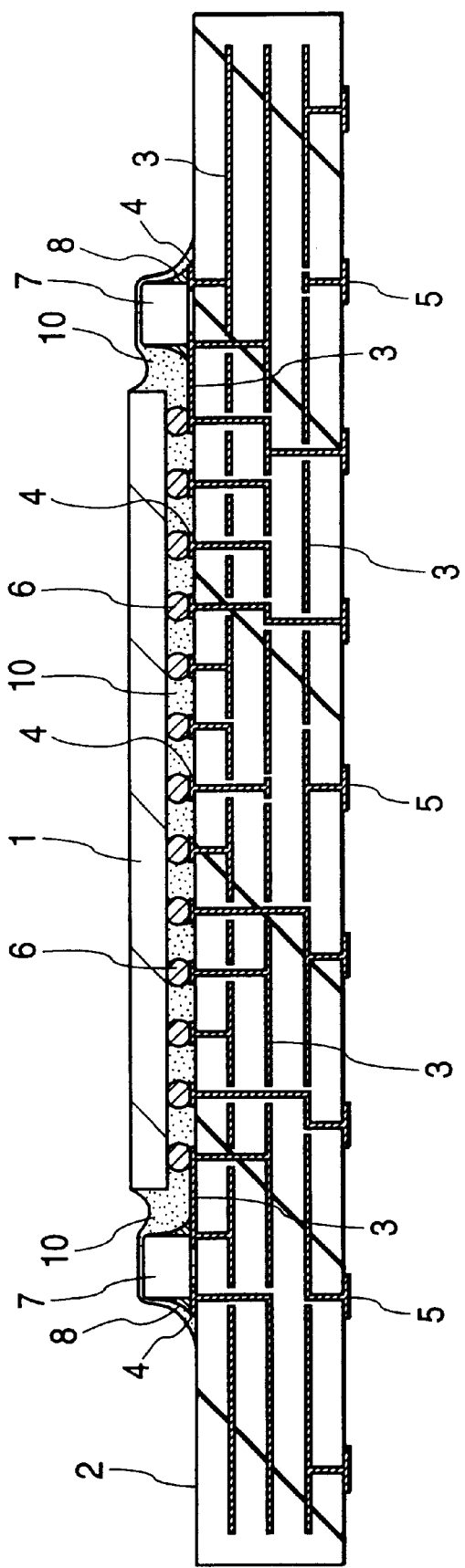

SEMICONDUCTOR DEVICE AND A METHOD OF MANUFACTURING THE SAME

FIELD OF THE INVENTION

The present invention relates to a semiconductor device and a method of manufacturing the same, particularly to a technology effectively applied to a semiconductor device having a package mounted with a semiconductor chip and a passive element on the same substrate.

BACKGROUND OF THE INVENTION

Japanese Patent Laid-Open No. 46098/1996 (U.S. Pat. No. 5,533,256) discloses a package having a heat sink for radiating heat to the outside of a semiconductor chip formed with an integrated circuit (hereinafter, simply referred to as chip).

According to one mode of the package described in this publication, a chip is mounted by bonding it face down on a pad formed at an upper face of a module substrate via a solder ball. The pad and the solder ball are sealed by a seal member filled in a clearance between the module substrate and the chip.

One or more electronic devices such as a decoupling condenser is mounted along with the chip at the upper face of the module substrate. Further, a cap for sealing the chip and the electronic devices are fixedly attached to the upper face of the module substrate via the seal member and the heat sink is fixedly attached to an upper face of the cap via an adhering agent. A clearance between an upper face (rear face) of the chip and a lower face of the cap is filled with a heat conductive member and heat generated at the chi is transmitted to the heat sink via the heat conductive member and the cap.

According to other mode of the package described in the publication, the heat sink is directly bonded to the upper face (rear face) of the chip via a double-sided pressure-sensitive heat-conductive adhering tape. According to the mode, a cap for sealing the chip and the electronic devices is eliminated and accordingly, heat generated by the chip is transmitted to the heat sink more efficiently.

SUMMARY OF THE INVENTION

According to a high-speed LSI in recent years, reduction of noise in driving thereof poses an important problem and as a countermeasure against noise, a small-sized large capacity chip condenser is mounted on a substrate mounted with the chip to thereby reduce noise in a middle frequency area.

In this case, it is preferred that the condenser is arranged as close proximity as possible to the chip to thereby shorten wirings connecting both. However, a heat generating amount of the chip formed with the high-speed LSI is large and accordingly, when the condenser is arranged at an extremely close proximity of the chip, the condenser is exposed to an abrupt temperature change when operating the chip and a deterioration in connection reliability between the condenser and the substrate poses a problem.

Further, as in the package described in the publication, according to a package sealing the chip and the condenser mounted on the substrate by a cap, when a heat conductive member is filled between the chip and the cap in fabrication steps thereof, a large amount of the heat conductive member must be supplied with an object of absorbing dimensional tolerance of the cap and accordingly, when the condenser is arranged at the extreme proximity of the chip, the heat conductive member extruded from an end portion of the chip is brought into contact with the condenser.

As a result, the condenser is not only exposed to radiation heat from the chip but is exposed to intense heat conducted from the heat conductive member and the deterioration of the connection reliability in connecting to the substrate poses further serious problem. Further, when the heat conductive member comprises an electricity conductive material such as an Ag paste, there also poses a problem that the chip and the condenser or the condensers are short-circuited via the heat conductive member.

It is an object of the invention to provide a technology for promoting connection reliability of a passive element mounted at a vicinity of a chip.

It is other object of the invention to provide a technology to ensure electric reliability of a passive element mounted at a vicinity of a chip.

The object and other object and a novel feature of the invention will become apparent from description and attached drawings of the specification.

A simple explanation will be given of an outline of representative aspects of the invention disclosed in the application as follows.

According to an aspect of the invention, there is provided a semiconductor device comprising a substrate having a wiring layer, a semiconductor chip mounted onto a main face of the substrate in face down bonding, a passive element mounted onto the main face of the substrate, a seal resin filled between a main face of the semiconductor chip and the main face of the substrate, a cap for sealing the semiconductor chip and the passive element, and a heat conductive member filled between the cap and the semiconductor chip, wherein the passive element is arranged in an area coated with the seal resin and at least a portion thereof is covered by the seal resin.

According to other aspect of the invention, there is provided a method of manufacturing a semiconductor device comprising following steps:

(a) a step of mounting a semiconductor chip onto a main face of a substrate having a wiring layer in face down bonding;

(b) a step of mounting a passive element to a vicinity of an area mounted with the semiconductor chip on the main face of the substrate;

(c) a step of filling a seal resin into a clearance between a main face of the semiconductor chip and the main face of the substrate and covering the passive element by the seal resin;

(d) a step of supplying a heat conductive member on an upper face of the semiconductor chip; and (e) a step of fixedly attaching a cap for sealing the semiconductor chip and the passive element onto an upper face of the semiconductor chip via a heat conductive member.

BRIEF DESCRIPTION OF THE DRAWINGS

FIG. 8 is a sectional view showing the method of manufacturing the semiconductor device constituting the one embodiment of the invention;

FIG. 9 is a sectional view showing the method of manufacturing the semiconductor device constituting the one embodiment of the invention;

DESCRIPTION OF THE PREFERRED EMBODIMENTS

A detailed explanation will be given of embodiments of the invention in reference to the drawings as follows. Further, in all the drawings for explaining the embodiments, the same member is attached with the same notation and repetitive explanation thereof will be omitted.

Embodiment 1

Figure 1:
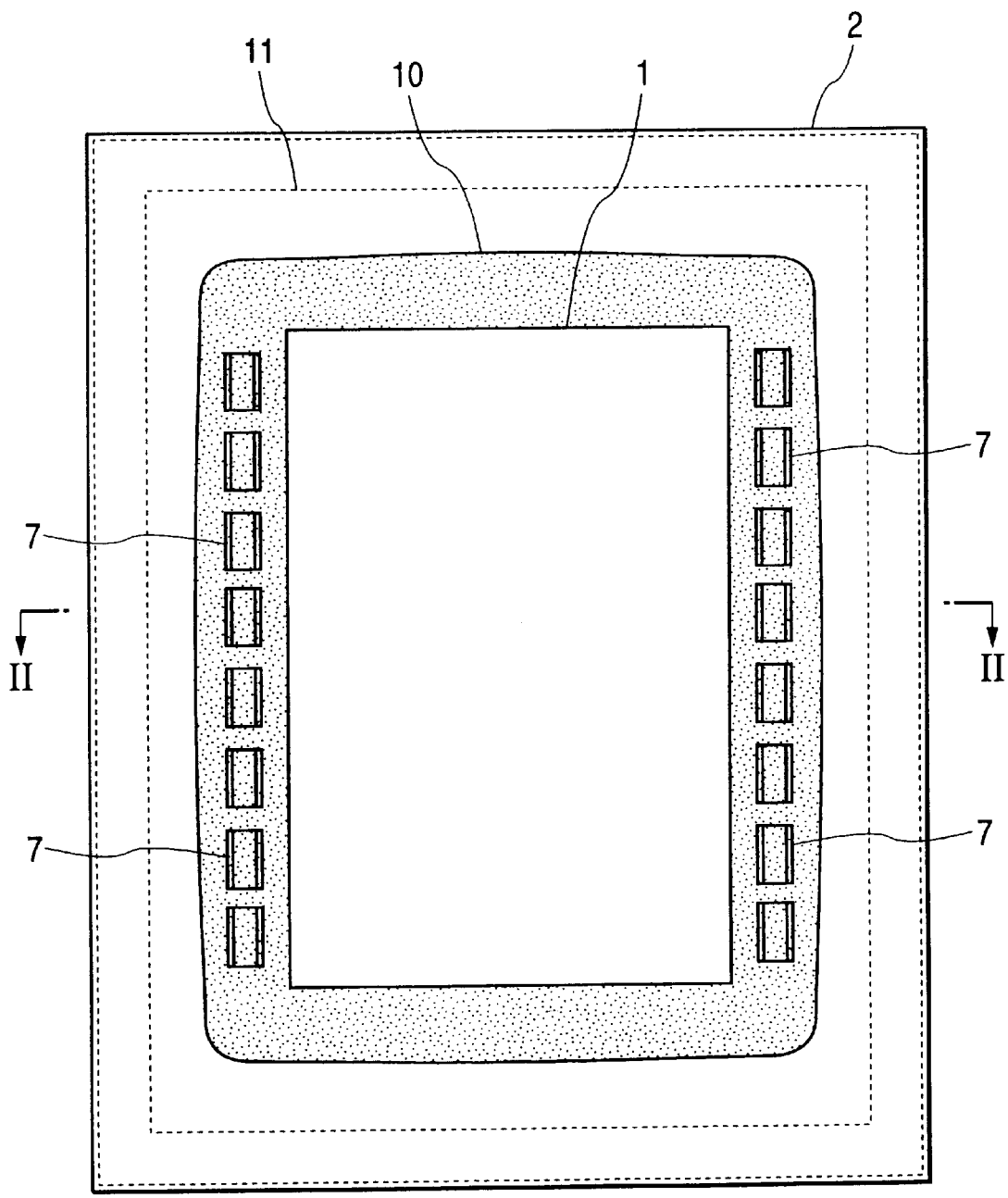
FIG. 1 is a plane view of a semiconductor device according to an embodiment of the invention.
Figure 2:
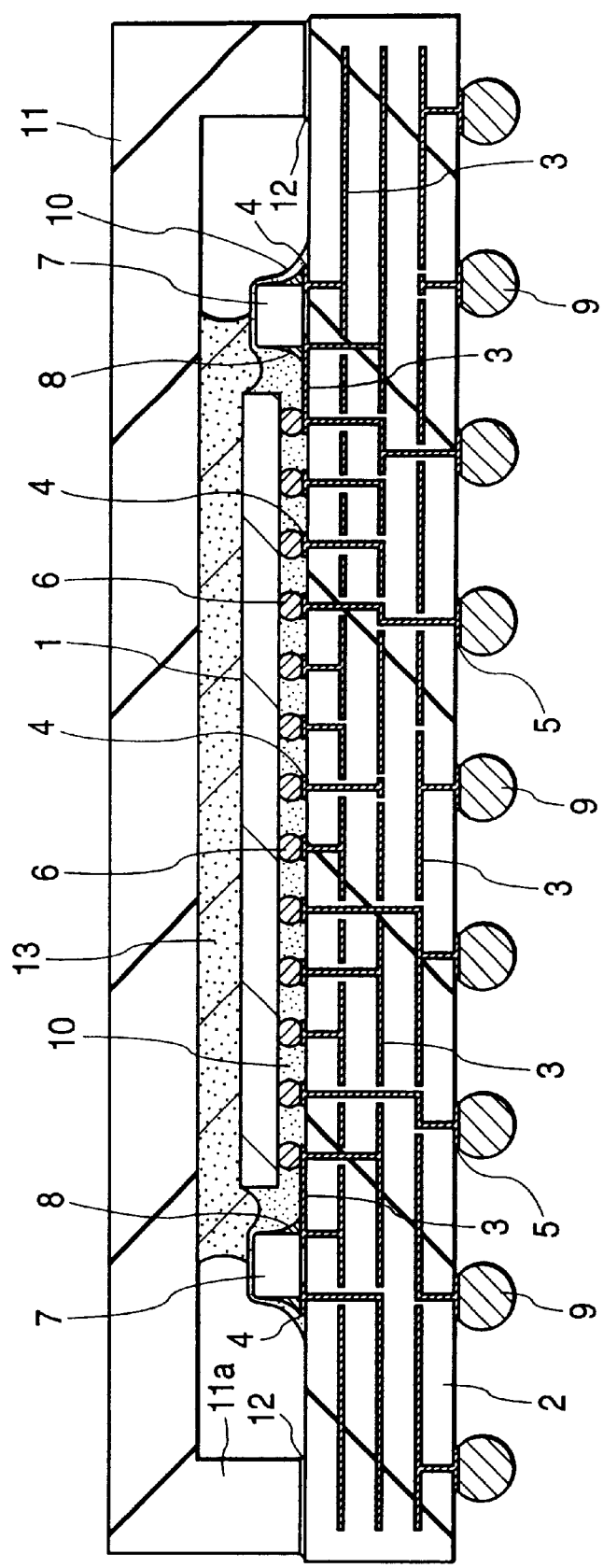
FIG. 2 is a sectional view taken along a line II—II of FIG. 1.
Figure 3:
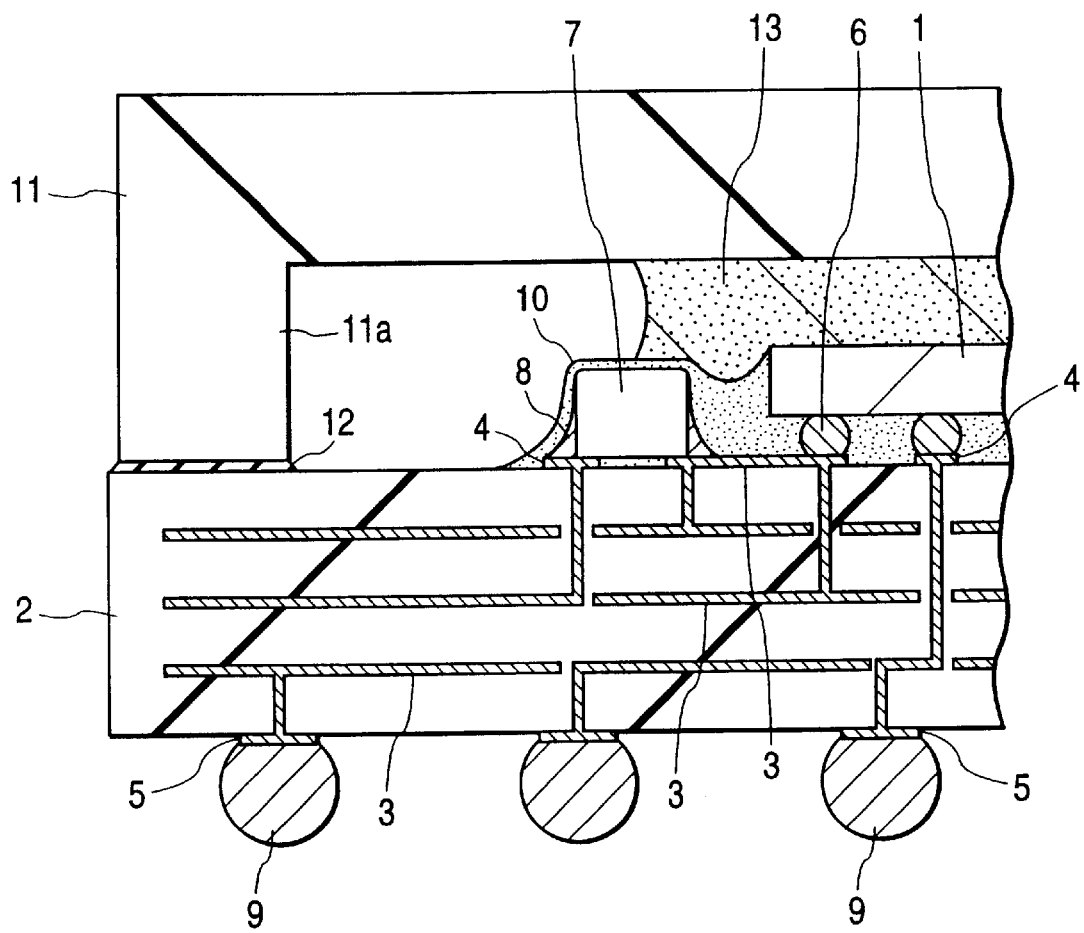
FIG. 3 is a sectional view enlarging essential portions 2.

FIG. 1 is a plane view of a semiconductor device according to the embodiment, FIG. 2 is a sectional view taken along a line II—II of FIG. 1 and FIG. 3 is a sectional view enlarging essential portions of FIG. 2.

The semiconductor device according to the embodiment is, for example, a package for mounting a memory chip 1 formed with a high-speed cash memory for a high-speed microprocessor (MPU: ultra small operation processing unit).

A package substrate 2 of the semiconductor device is constituted by ceramic and at inside thereof, there are formed a plurality of layers of wirings 3 constituting a wiring for signal, a power source wiring and a ground wiring. Further, a main face (upper face) and a lower face of the package substrate 2 are formed with pluralities of electrode pads 4 and 5 electrically connected to the wirings 3. The wiring 3 and the electrode pads 4 and 5 comprise W (tungsten) and surfaces of the electrode pads 4 and 5 are coated with a plating of Ni (nickel) and Au (gold).

A central portion of the main face of the package substrate 2 is mounted with the memory chip 1 in face down bonding by a flip chip bonding system. That is, the memory chip 1 is electrically connected to the electrode pads 4 at the main face of the package substrate 2 via a plurality of solder bumps (bump electrodes) 6 connected to a main face (lower face) of the memory chip 1.

Figure 4:
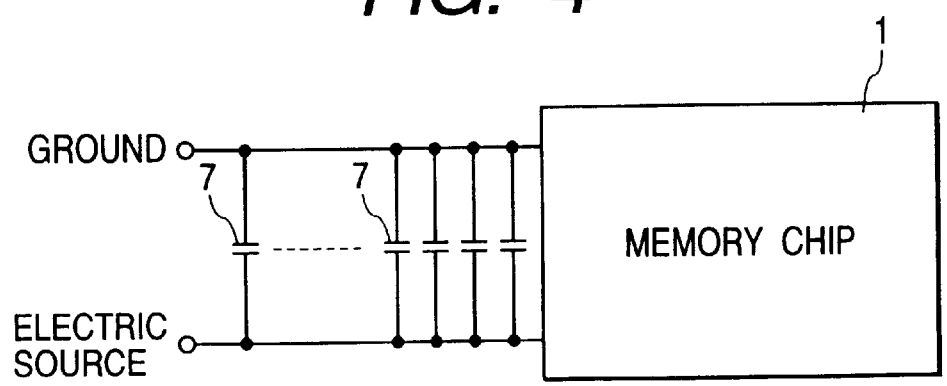
FIG. 4 is a diagram showing a state of connecting a memory chip and chip condensers.

A plurality of chip condensers 7 are mounted at vicinities of the memory chip 1. The chip condensers 7 are arranged along an outer periphery of the memory chip 1 and are electrically connected to the electrode pads 4 at the main face of the package substrate 2 via solder 8. As shown by FIG. 4, the chip condensers 7 are connected in parallel between the power source wiring and the ground wiring of the package substrate 2 and realizes high-speed operation by reducing noise caused in driving the memory chip 1.

The electrode pads 5 at the lower face of the package substrate 2 are connected with a plurality of solder bump 9 constituting outside connecting terminals of the semiconductor device (package). The solder bumps 9 comprise a solder material having a melting point lower than that of the solder bumps 6 connected to the main face of the memory chip 1. The semiconductor device is mounted to a mother board of a computer via the solder bumps 9.

A clearance between the main face (lower face) of the memory chip 1 and the main face of the package substrate 2, is filled with underfill resin (seal resin) 10 constituting a seal member for achieving protection of connecting portions for connecting the both and relaxation of thermal stress. The underfill resin 10 comprises, for example, an insulating material such as epoxy resin filled with silica.

An outer edge of the underfill resin 10 is extended to an outer side of the memory chip 1 and covers entire faces of the chip condensers 7 mounted to vicinities of the memory chip 1. Further, portions of the underfill resin 10 are filled also to clearances between lower faces of the chip condensers 7 and the main face of the package substrate 2. That is, the underfill resin 10 is filled in the clearances between the memory chip 1 and the respective lower faces of the condensers 7 and the main face of the package substrate 2.

The memory chip 1 and the chip condenser 7 mounted to the main face of the package substrate 2, are sealed by a cap 11 made of ceramic and covering a total of the main face of the package substrate 2. Leg portions 11a of the cap 11 are fixedly attached to the main face of the package substrate 2 via an adhering agent 12.

A clearance between a lower face of the cap 11 and the upper face of the memory chip 1, is filled with a heat conductive member 13 for radiating heat generated in driving the memory chip 1 to outside via the cap 11. The heat conductive member 13 is constituted by an electricity conductive material having high heat conductivity such as Ag paste.

As described later, in a step of integrating the package, when the heat conductive member 13 is filled between the memory chip 1 and the cap 11, in order to absorb a dimensional tolerance of the cap 11 (dispersion in height of the leg portion 11a), a large amount of the heat conductive member 13 is supplied. For that purpose, an outer edge of the heat conductive member 13 is extended to an outer side of the memory chip 1 and portions thereof reach upper faces of the chip condensers 7 mounted at vicinities of the memory chip 1.

However, according to the semiconductor device of the embodiment, the underfill resin 10 constituted by an insulating material is not only filled to the clearance between the memory chip 1 and the package substrate 2 but also covers entire faces of the chip condensers 7 and accordingly, there is no concern of shortcircuiting the chip condensers 7 and shortcircuiting the chip condensers 7 and the memory chip 1 via the electricity conductive heat conductive member 13 extruded to the outer side of the memory chip 1.

Further, according to the semiconductor device of the embodiment, the chip condensers 7 arranged at vicinities of the memory chip 1 are covered by the underfill resin 10 and accordingly, connection strength in connecting the chip condenser 7 and the package substrate 2 is high. Thereby, a deterioration in connection reliability in connecting the chip condenser 7 and the electrodes 4 is restrained and accordingly, connection life of the chip condensers 7 is promoted.

Next, an explanation will be given of a method of manufacturing the semiconductor device according to the embodiment constituted as described above in an order of steps in reference to FIG. 5 through FIG. 13.

Figure 5:
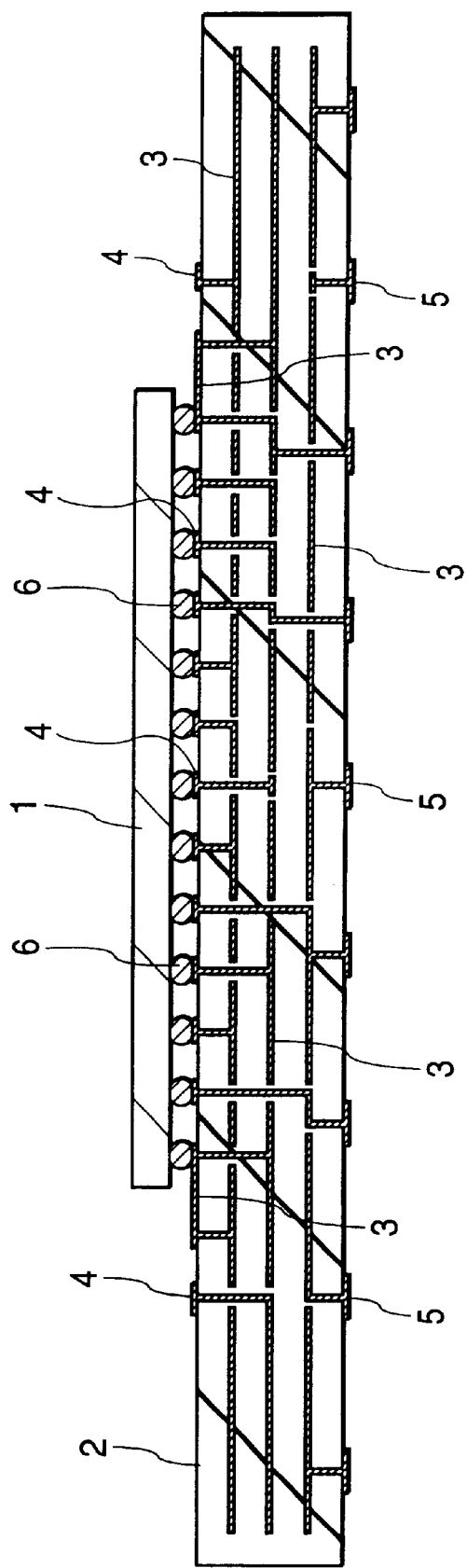
FIG. 5 is a sectional view showing a method of manufacturing a semiconductor device constituting the one embodiment of the invention.

In integrating the package, first, as shown by FIG. 5, the solder bumps 6 previously connected to the main face of the memory chip 1 are positioned on the electrode pads 4 at the main face of the package substrate 2 and thereafter, the solder bump 6 are made to reflow, thereby, the memory chip 1 is mounted to the central portion of the main face of the package substrate 2 by face down bonding. The solder bump 6 is constituted by a Pb—Sn alloy including, for example, 2 weight % of Sn (liquidus temperature: 320° C. through 325° C.).

Figure 6:
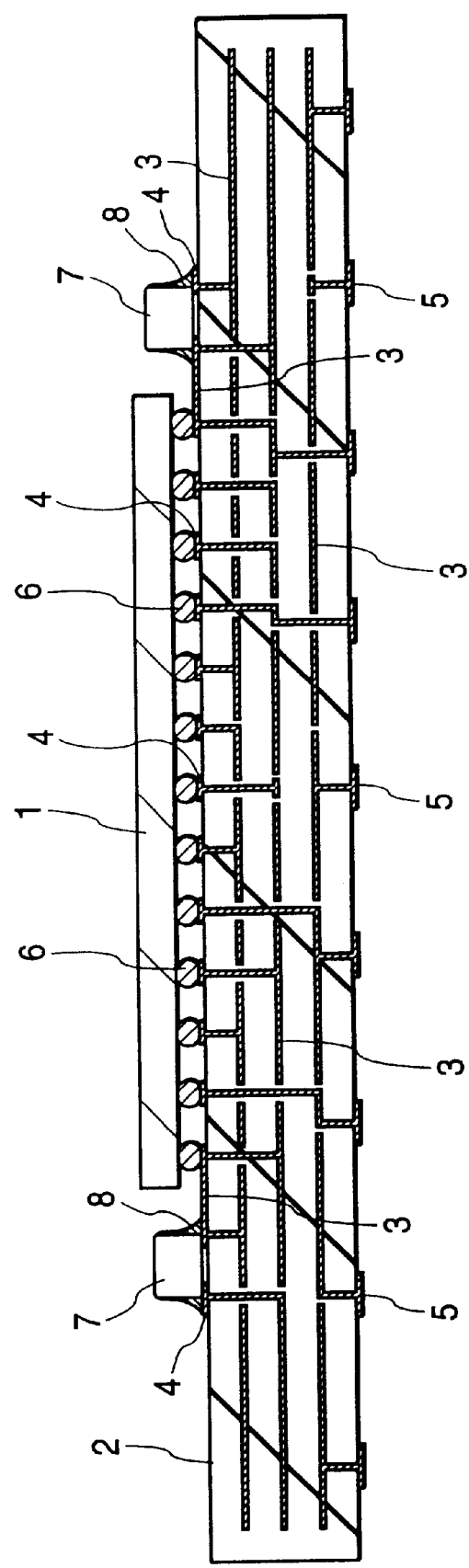
FIG. 6 is a sectional view showing the method of manufacturing the semiconductor device constituting the one embodiment of the invention.
Figure 7A:
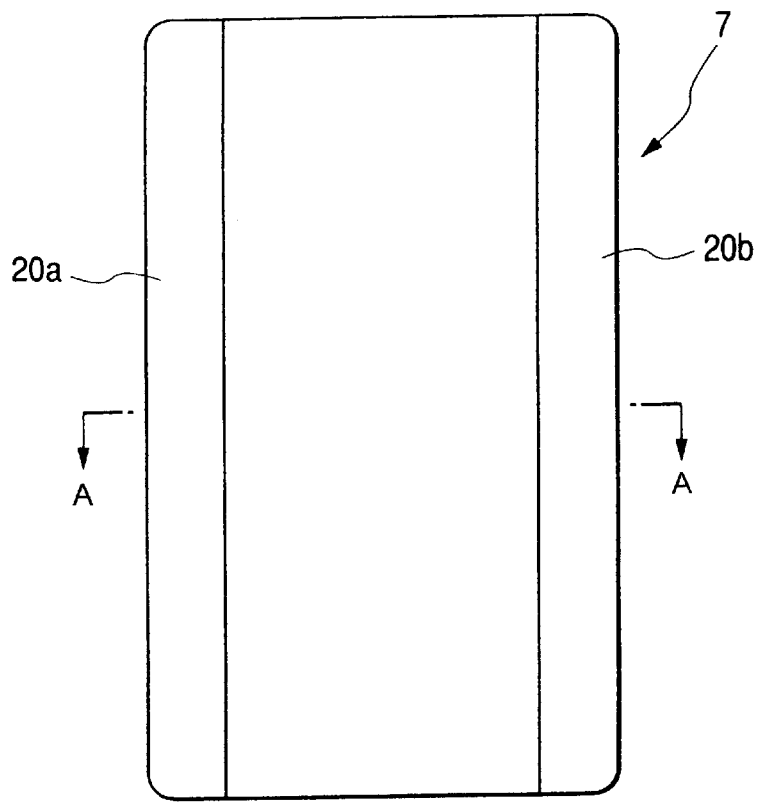
FIG. 7A is a plane view of a chip condenser.
Figure 7B:
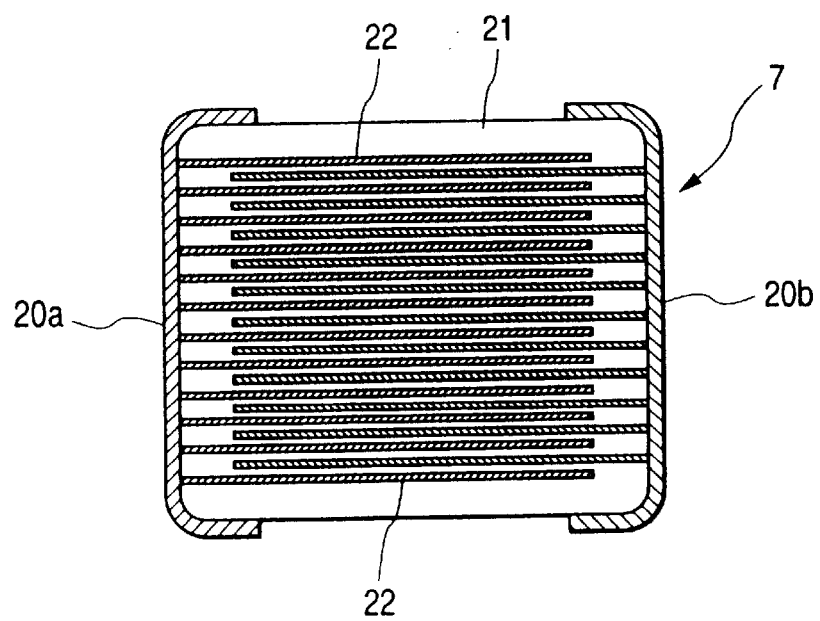
FIG. 7B is a sectional view taken along a line A—A of FIG. 7A.

Next, after removing flux residue by cleaning the main face of the package substrate 2, as shown by FIG. 6, the chip condensers 7 are mounted on the electrode pads 4 at vicinities of the memory chip 1. For example, as shown by FIGS. 7A and 7B, the chip condenser 7 is formed with electrodes 20a and 20b by plating at opposed two sides of a rectangle and at inside thereof, Ni electrodes 22 in thin pieces alternately overlap while sandwiching a high dielectric member 21 comprising barium titanate ($BaTiO_3$) thereamong. In mounting the chip condenser 7, the solder 8 is previously formed on surfaces of the electrodes 20a and 20b by plating, preparatory solder is coated on surfaces of electrode pads 4 of the package substrate 2 by screen printing or the like, successively, the electrodes 20a and 20b are positioned on the electrode pads 4 and thereafter, the solder 8 is made to reflow. The solder 8 comprises, for example, an Sn—Ag alloy including 3 weight % of Ag (melting point: 221° C.). Further, an order of mounting the memory chip 1 and the chip condensers 7 on the package substrate 2 may be reverse to the above-described. Further, after positioning the memory chip 1 and the chip condensers 7 on the electrode pads 4, the solder bumps 6 and the solder 8 may be made to reflow simultaneously and summarizingly.

Next, after cleaning again the main face of the package substrate 2 to thereby remove flux residue, as shown by FIG. 8, the underfill resin 10 is supplied to the outer periphery of the memory chip 1. The underfill resin 10 is supplied by, for example, scanning a dispenser 30 along one side of the memory chip 1.

Next, in order to promote fluidity of the underfill resin 10, the package substrate 2 is heated to about 70° C. Thereby, as shown by FIG. 9, the underfill resin 10 is filled to the respective lower faces of the memory chip 1 and chip condensers 7 by the capillary phenomenon. Further, when the amount of supplying the underfill resin 10 is pertinent, the entire faces of the chip condensers 7 are covered by the underfill resin 10. Thereafter, the underfill resin 10 is cured by baking at about 150° C.

In this way, in filling the underfill resin 10 to the lower face of the memory chip 1, by simultaneously covering the entire faces of the chip condensers 7 by the underfill resin 10, the step can be simplified.

Figure 10:
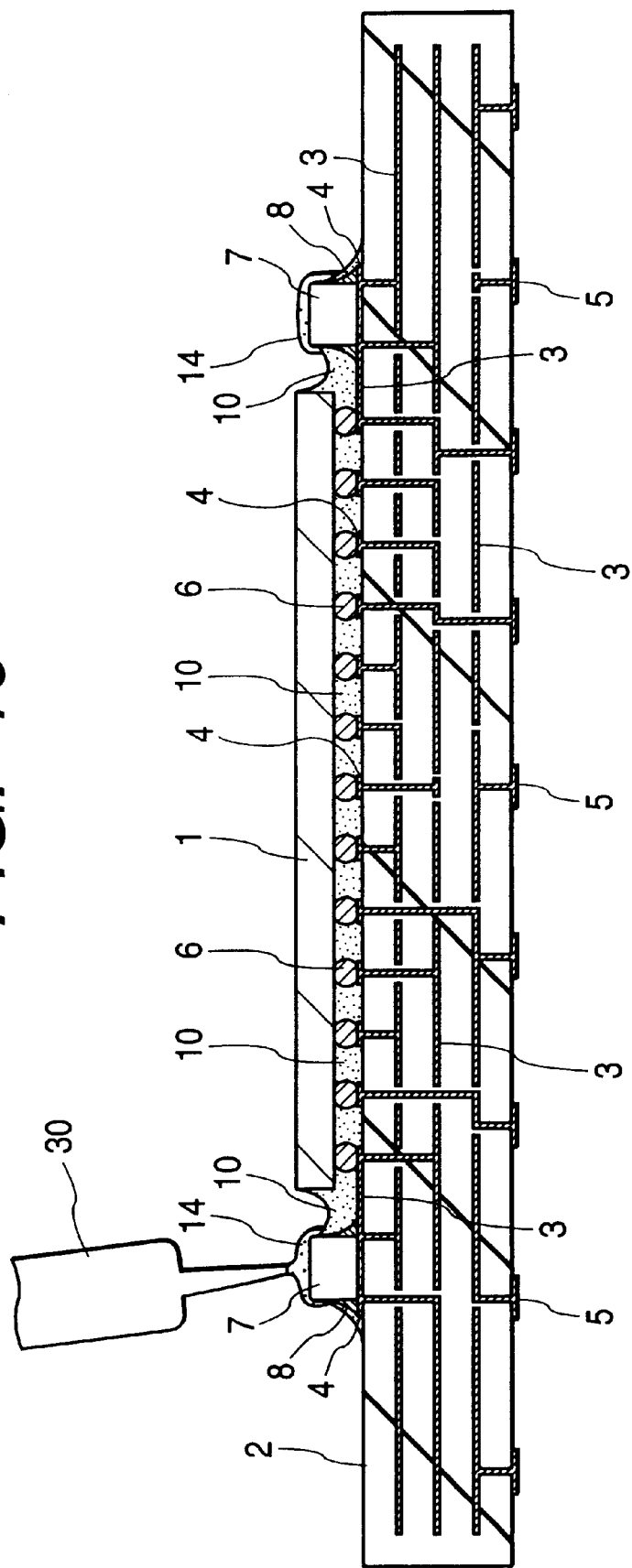
FIG. 10 is a sectional view showing the method of manufacturing the semiconductor device constituting the one embodiment of the invention.

Covering of the chip condensers 7 may be carried out by using a covering material other than the underfill resin 10. That is, as shown by FIG. 10, there may be constituted a procedure in which the underfill resin (first seal resin) 10 is filled to the lower faces of the memory chip 1 and the chip condensers 7, successively, the chip condensers 7 are covered by separately prepared coating resin (second seal resin) 14 and thereafter, the underfill resin 10 and the coating resin 14 are simultaneously baked and cured. In this case, by integrating the underfill resin 10 and the coating resin 14, connection strength in connecting the chip condensers 7 and the package substrate 2 can be promoted. Further, a thickness of the resin for covering the chip condensers 7 can be thinned. Although resin having low viscosity is used for the underfill resin 10 since the resin is filled by utilizing the capillary phenomenon, the coating resin 14 is for forming extremely thin coating and there is used epoxy resin or silicone varnish having a content of silica filler lower than that of the underfill resin 10 and having a viscosity lower than that of the under fill resin 10.

Figure 11:
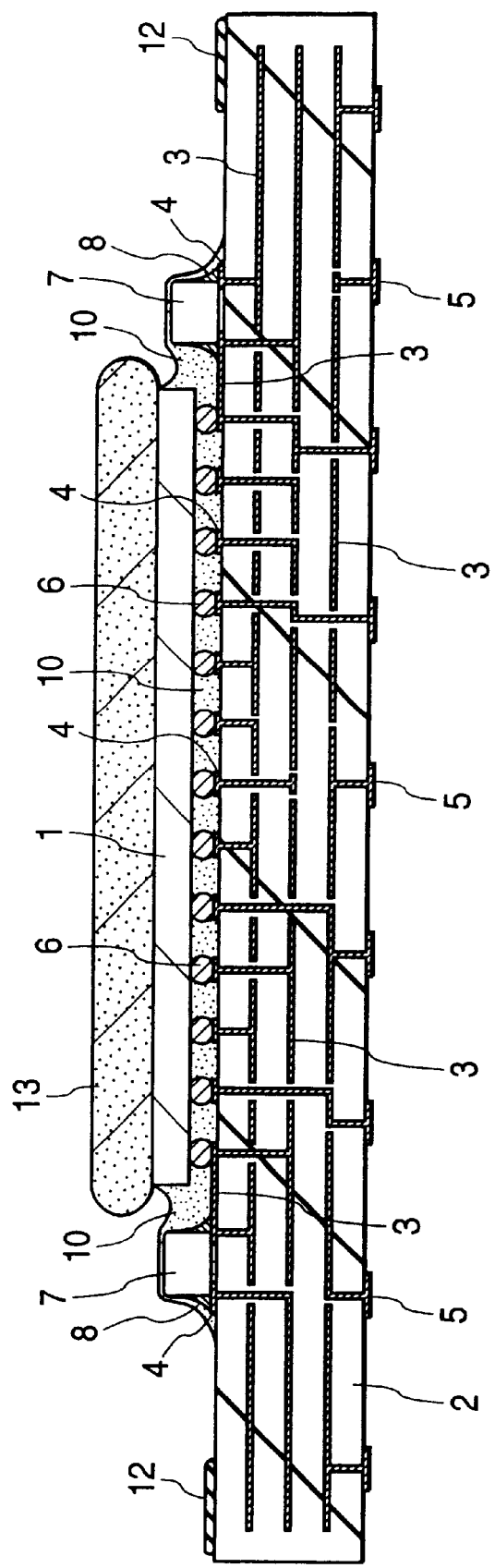
FIG. 11 is a sectional view showing the method of manufacturing the semiconductor device constituting the one embodiment of the invention.

Next, as shown in FIG. 11, the heat conductive member (Ag paste) 13 is supplied to the upper face of the memory chip 1 by using a dispenser, not illustrated. The heat conductive member 13 is supplied by an amount slightly larger than a necessary amount in order to absorb the dimensional tolerance of the cap 11 (dispersion of height of leg portion 11a). Further, at this occasion, the adhering agent 12 is supplied to a peripheral portion of the main face of the package substrate 2.

Figure 12:
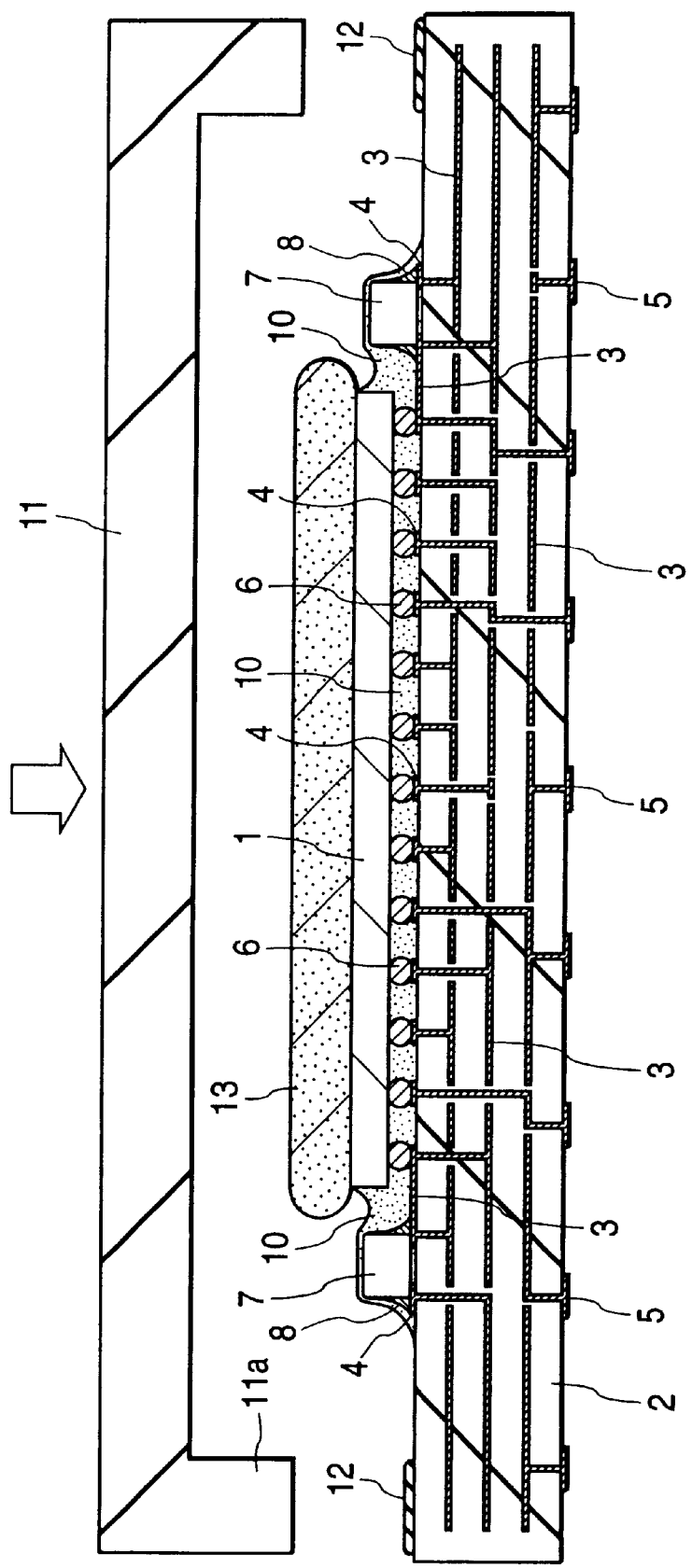
FIG. 12 is a sectional view showing the method of manufacturing the semiconductor device constituting the one embodiment of the invention.
Figure 13:
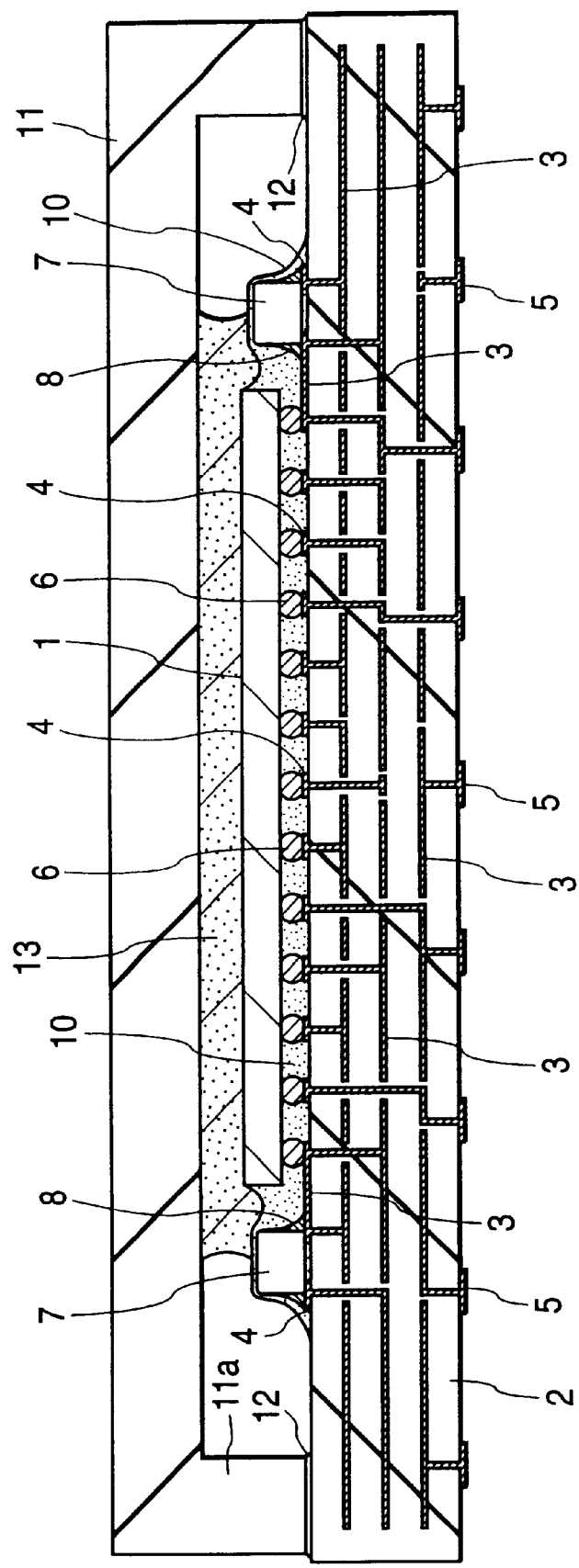
FIG. 13 is a sectional view showing the method of manufacturing the semiconductor device constituting the one embodiment of the invention.

Next, as shown by FIG. 12 and FIG. 13, by positioning the cap 11 on the package substrate 2 and heating and curing the heat conductive member 13 and the adhering agent 12, the cap 11 is fixedly attached onto the package substrate 2. At this occasion, although the outer edge of the heat conductive member 13 may reach the upper faces of the chip condensers 7, as described above, since the chip condensers 7 are covered by the underfill resin 10, the chip condensers 7 are not shortcircuited or the chip condensers 7 and the memory chip 1 are not shortcircuited by the heat conductive member 13.

Thereafter, after supplying solder balls (not illustrated) constituted by a Pb—Sn eutectic alloy having a low melting point to the surfaces of the electrode pads 5 at the lower face of the package substrate 2, the solder balls are made to reflow and the solder bumps 9 are formed on the surfaces of the electrode pads 5 thereby finishing the semiconductor device shown in FIG. 1 through FIG. 4.

Figure 14:
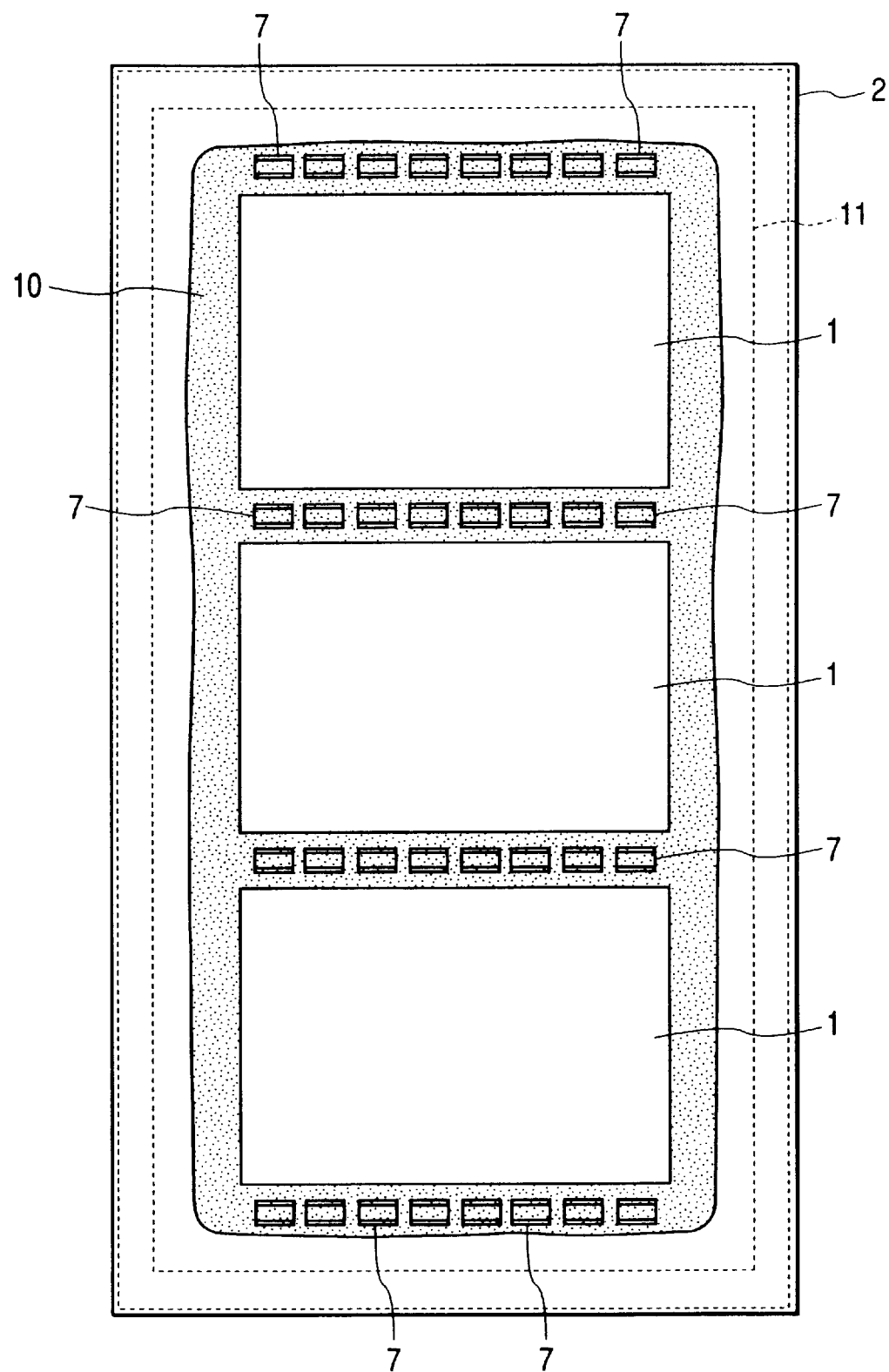
FIG. 14 is a plane view of a semiconductor apparatus According to other embodiment of the invention.
Figure 15:
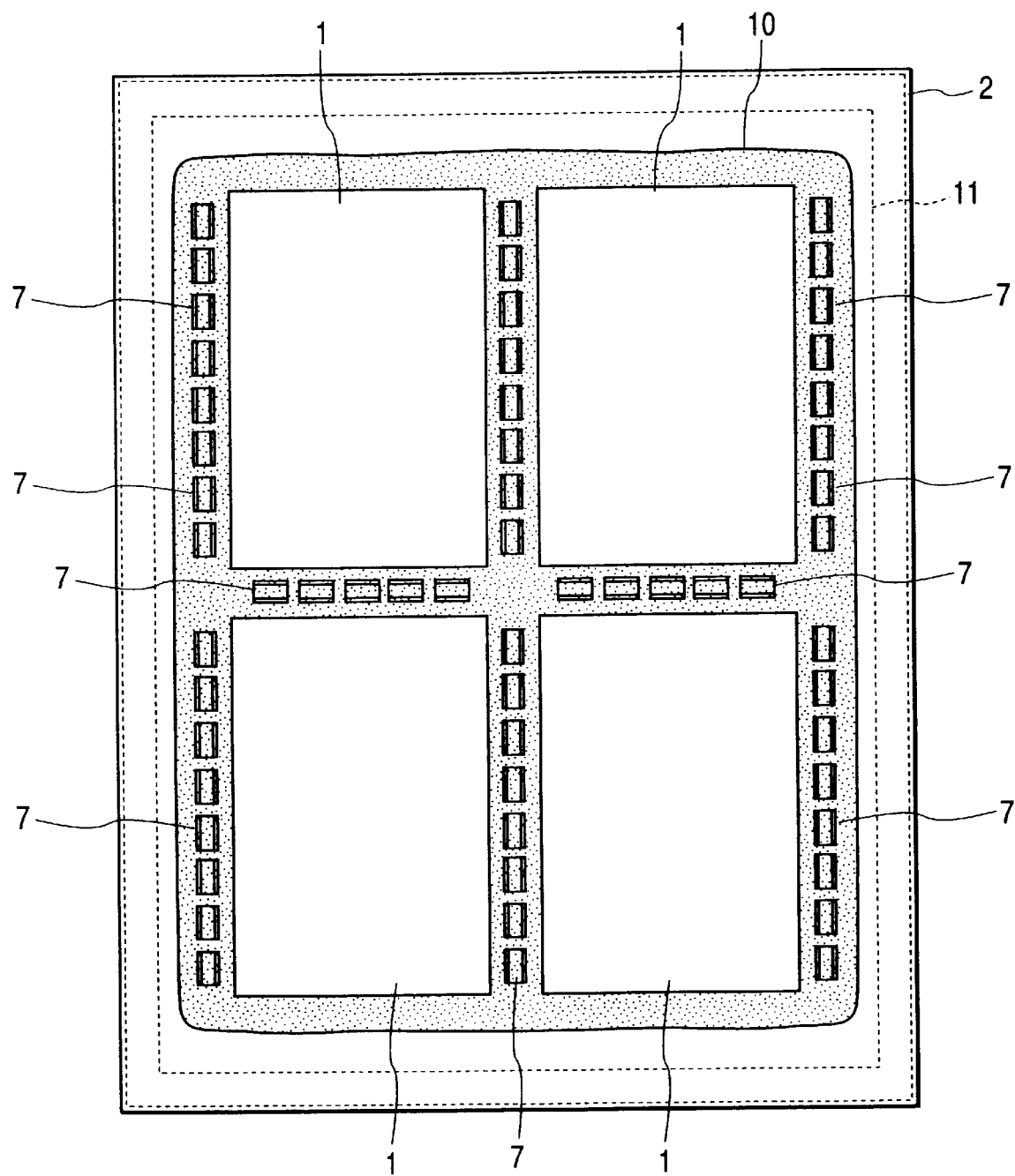
FIG. 15 is a plane view of a semiconductor apparatus according to other embodiment of the invention.

Although according to the embodiment, an explanation has been given of the case in which only a single piece of the memory chip 1 is mounted on the package substrate 2, the embodiment is applicable also to a case of mounting two pieces or more of the memory chips 1. For example, FIG. 14 shows an example of mounting three pieces of the memory chips 1 on the package substrate 2 and FIG. 15 shows an example of mounting four pieces of the memory chips 1 thereon. Although in these cases, the chip condensers 7 are arranged at extreme vicinities of the memory chip 1 since the wirings 3 between the chip condensers 7 and the memory chip 1 are requested to be short, by covering the chip condensers 7 by the underfill resin 10, promotion of connection life and prevention of shortcircuit failure can be achieved.

Embodiment 2

Figure 16:
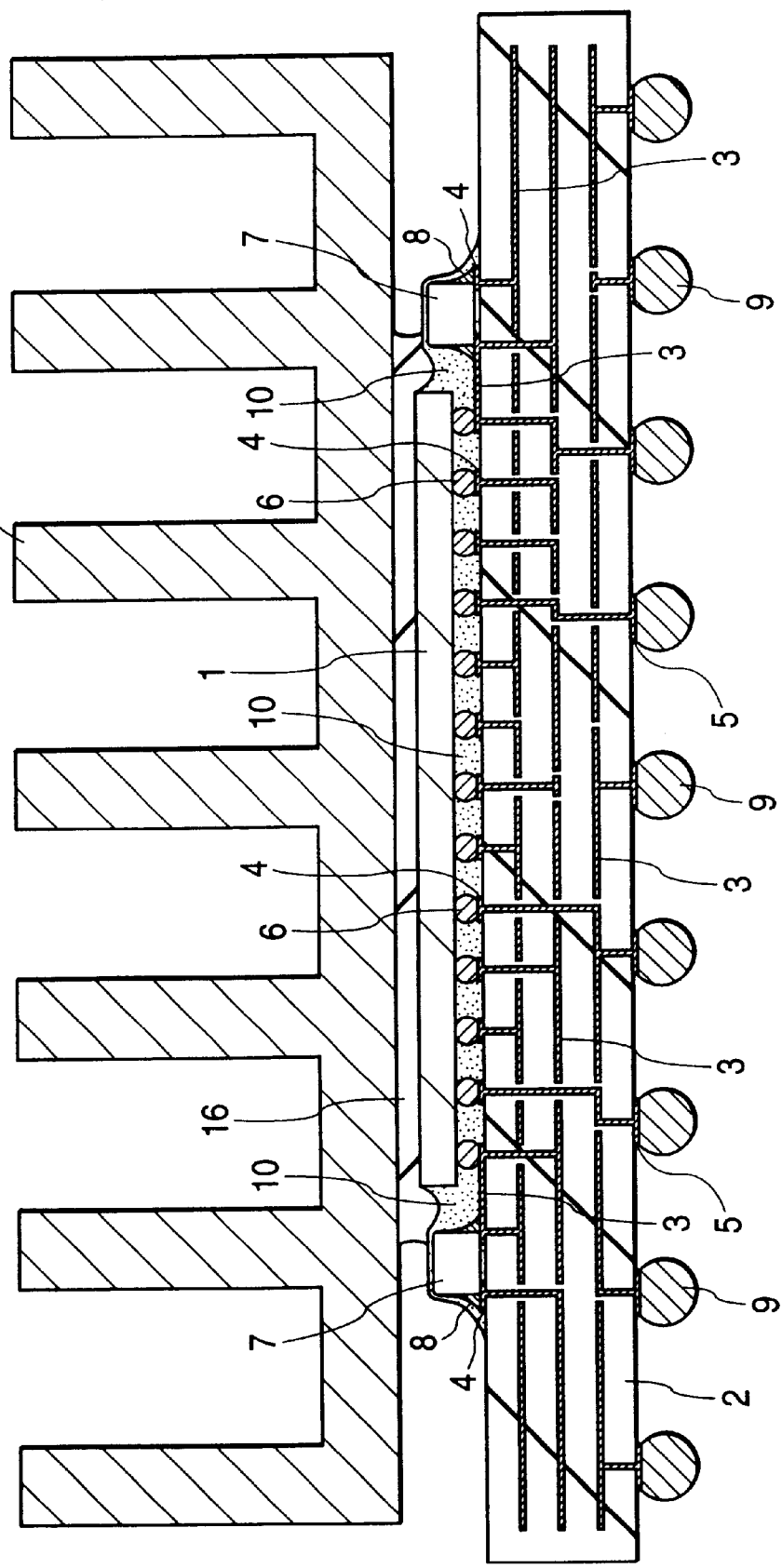
FIG. 16 is a plane view of a semiconductor apparatus according to other embodiment of the invention.

Although in Embodiment 1, described above, an explanation has been given of the case in which the memory chip 1 and the chip condensers 7 are applied to the package sealed by the cap 11, the invention is also applicable to a package in which, for example, as shown by FIG. 16, heat radiating fins (heat sinks) 15 or a flat heat radiating plate is connected to the upper face of the memory chip 1 via a heat conductive member 16. Further, the invention is applicable also to a case in which the heat conductive member 16 comprises an insulating material having high heat conductivity such as BN (boron nitride) or alumina.

When the heat conductive member 16 comprises an insulating material, the problem of the shortcircuit failure is not caused, however, when the chip condensers 7 are arranged at vicinities of the memory chip 1, a deterioration in connection life caused by heat generation of the memory chip 1 poses a problem.

Figure 17:
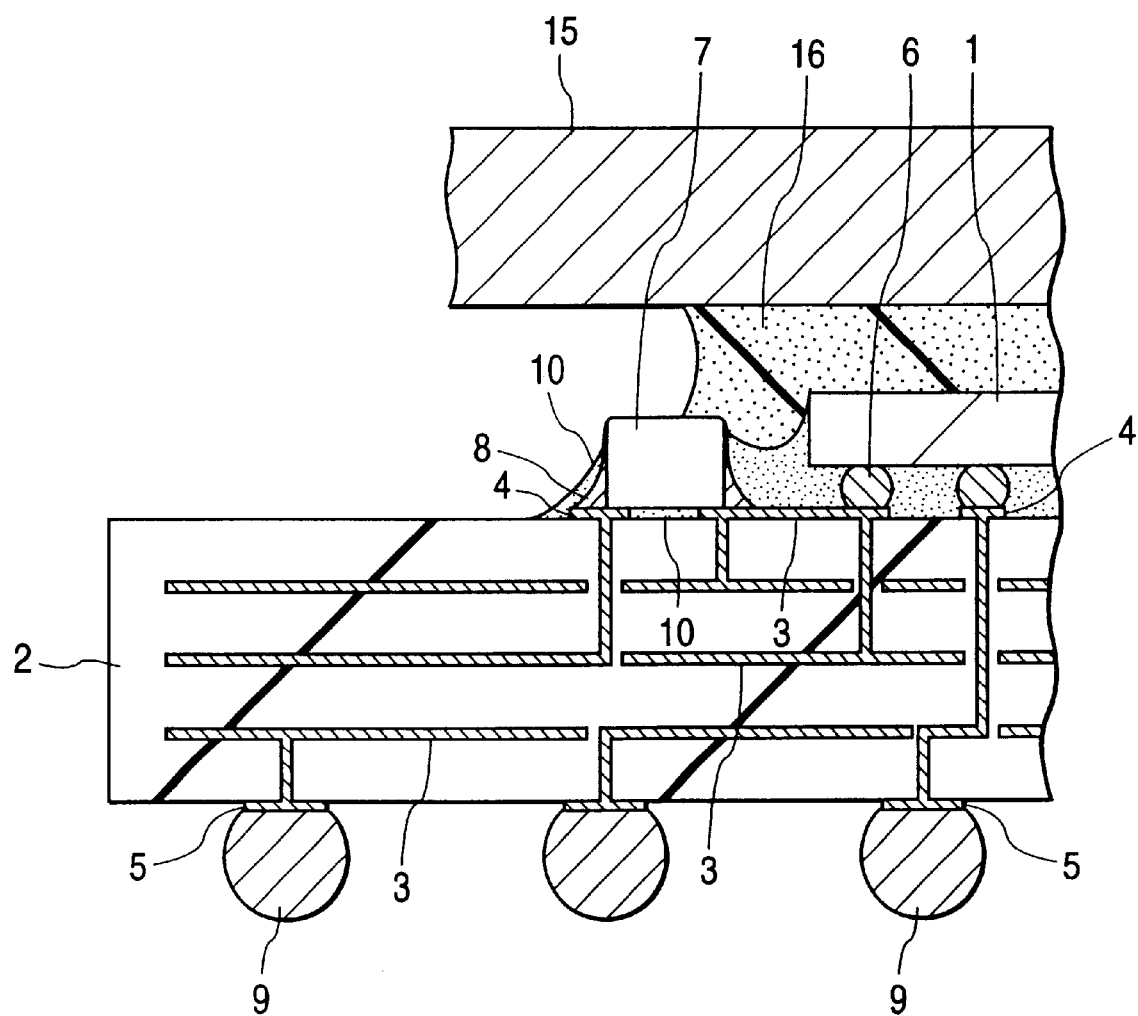
FIG. 17 is a sectional view enlarging essential portions of a semiconductor apparatus constituting other embodiment of the invention.

Therefore, in this case, as shown by FIG. 17, by filling the underfill resin 10 below the chip condensers 7, the connection strength in connecting the chip condensers 7 and the electrodes 4 is promoted and the connection life of the chip condensers 7 is promoted.

Further, also in the case of the package according to the embodiment, when the heat conductive member 16 comprises an electricity conductive material, the heat conductive member 16 may be extruded to the outer side of the memory chip 1 by a dispersion in an amount of supplying the heat conductive member 16 and accordingly, the shortcircuit failure poses a problem. Therefore, also in this case, by covering the chip condensers 7 by the underfill resin 10, there can be prevented the failure of shortcircuiting the chip condensers 7 and shortcircuiting the chip condensers 7 and the memory chip 1 via the electricity-conductive heat conductive member 16 extruded to the outer side of the memory chip 1.

Although as described above, a specific explanation has been given of the invention which has been carried out by the inventors based on the above-described embodiments, the invention is not limited to the embodiments and can naturally be modified variously within a range not deviated from gist thereof.

Although according to the embodiments, an explanation has been given of the case in which the invention is applied to the package mounted with the high-speed memory chip, the invention is not limited thereto but is generally applicable widely to a package arranged with chip condensers at vicinities of a semiconductor chip formed with high-speed LSI having a large heat generating amount.

Further, the invention is not limited to the chip condenser but is applicable widely to a package arranged with a passive element such as a resistor element at a vicinity of a semiconductor chip having a large heat generating amount.

A simple explanation will be given of an effect achieved by representative aspects of the invention disclosed in the application as follows.

According to the invention, by covering a passive element arranged at a vicinity of a semiconductor chip by seal resin, the passive element is not directly exposed to high temperature of the semiconductor chip and accordingly, a deterioration in connection reliability of the passive element is restrained and connection life is promoted.

Further, when a heat conductive member filled between a semiconductor chip and a cap (or heat radiating plate) comprises an electricity conductive material, by covering the passive element by the seal resin, there can be prevented a failure of shortcircuiting the passive elements and shortcircuiting the passive elements and the semiconductor chip.

What is claimed is:

1. A semiconductor device comprising:

a substrate having a wiring layer;

a semiconductor chip mounted onto a main face of the substrate by face down bonding;

a passive element mounted onto the main face of the substrate;

a seal resin filled in a clearance between a main face of the semiconductor chip and the main face of the substrate;

a cap for sealing the semiconductor chip and the passive element; and a heat conductive member filled between the cap and the semiconductor chip;

wherein the passive element is arranged in an area coated with the seal resin and at least an upper face thereof is covered by the seal resin.

2. A semiconductor device comprising:

a substrate having a wiring layer;

a semiconductor chip mounted onto a main face of the substrate by face down bonding;

a passive element mounted onto the main face of the substrate;

a seal resin filled in a clearance between a main face of the semiconductor chip and the main face of the substrate; and a heat radiating member bonded to an upper face of the semiconductor chip via a heat conductive member;

wherein the passive element is arranged in an area coated with the seal resin and at least an upper face thereof is covered by the seal resin.

3. The semiconductor device according to claim 2:

wherein the heat conductive member comprises an electrically conductive material.

4. The semiconductor device according to claim 2:

wherein the heat conductive member comprises an insulating material.

5. The semiconductor device according to claim 2:

wherein the passive element is a chip condenser.

6. The semiconductor device according to claim 2:

wherein the semiconductor chip is mounted onto the main face of the substrate via a bump electrode.

7. The semiconductor device according to claim 2:

wherein a plurality of the semiconductor chips are mounted onto the main face of the substrate and the passive elements are arranged at clearances among the plurality of semiconductor chips.

8. The semiconductor device according to claim 2:

wherein the seal resin is filled in a clearance between the passive element and the main face of the substrate.

9. The semiconductor device according to claim 2:

wherein a rear face of the semiconductor chip on a side opposed to the main face is not covered by the seal resin and is brought into direct contact with the heat conductive member.

* * * * *